(12) United States Patent
Gunda et al.

(10) Patent No.: US 12,093,548 B2
(45) Date of Patent: Sep. 17, 2024

(54) STREAM ORIENTED WRITING FOR IMPROVING SEQUENTIAL WRITE AND READ PERFORMANCE

(71) Applicant: Western Digital Technologies, Inc., San Jose, CA (US)

(72) Inventors: Sridhar Prudviraj Gunda, Karnataka (IN); Kalpit Bordia, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 80 days.

(21) Appl. No.: 17/741,213

(22) Filed: May 10, 2022

(65) Prior Publication Data
US 2023/0367498 A1 Nov. 16, 2023

(51) Int. Cl.
*G06F 3/06* (2006.01)
*G06F 12/123* (2016.01)
*G11C 7/10* (2006.01)

(52) U.S. Cl.
CPC ............ *G06F 3/064* (2013.01); *G06F 3/0604* (2013.01); *G06F 3/0659* (2013.01); *G06F 3/0679* (2013.01); *G06F 12/123* (2013.01); *G11C 7/1039* (2013.01); *G06F 2212/7201* (2013.01)

(58) Field of Classification Search
CPC ...... G06F 3/064; G06F 3/0604; G06F 3/0659; G06F 12/123; G06F 2212/7201; G11C 7/1039
See application file for complete search history.

(56) References Cited

U.S. PATENT DOCUMENTS

| 2015/0074337 | A1* | 3/2015 | Jo | G06F 3/0679 |
| | | | | 711/103 |
| 2015/0347040 | A1* | 12/2015 | Mathur | G06F 3/0659 |
| | | | | 711/103 |
| 2018/0285282 | A1* | 10/2018 | Jakowski | G06F 12/0811 |
| 2021/0373804 | A1* | 12/2021 | Gorobets | G06F 3/068 |

* cited by examiner

*Primary Examiner* — Baboucarr Faal
(74) *Attorney, Agent, or Firm* — ARENTFOX SCHIFF LLP

(57) ABSTRACT

Aspects of a storage device are provided that optimize stream oriented writing of sequential data streams for improved read and write performance. The storage device includes a non-volatile memory including a plurality of blocks, and a controller configured to receive a plurality of host write commands each including a sequential data stream. In response to determining the host write commands include sequential data streams, the controller writes each of the sequential data streams respectively to different sequential open blocks, where the blocks are respectively associated with the sequential data streams. The controller may afterwards read each of the sequential data streams respectively from the different blocks. As a result, sequential data from multiple streams may not be stored in a mixed pattern in a same sequential block, thereby allowing the controller to issue fewer read or relocate commands in a block for a given sequential data stream.

11 Claims, 11 Drawing Sheets

STREAM ORIENTED WRITING FOR IMPROVING SEQUENTIAL WRITE AND READ PERFORMANCE

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may receive from a host a stream of data to be written to the flash memory. The flash storage device may determine where to write the data stream in memory based on whether the data stream is random or sequential. A random data stream includes data associated with uncorrelated logical addresses. For example, a random data stream may include logical block addresses (LBAs) with no specific sequence or pattern. In contrast, a sequential data stream includes data associated with correlated logical addresses. For example, a sequential data stream may include a sequence of consecutive LBAs.

SUMMARY

One aspect of a storage device is disclosed herein. The storage device includes a non-volatile memory including a plurality of blocks, and a controller. The controller is configured to receive a plurality of parallel host write commands, where each of the parallel host write commands includes a sequential data stream, and to write each of the sequential data streams to a different one of the blocks in response to the parallel host write commands.

Another aspect of a storage device is disclosed herein. The storage device includes a non-volatile memory including a plurality of blocks, and a controller. The controller is configured to receive a host write command, to determine whether the host write command includes a sequential data stream, and in response to determining the host write command includes the sequential data stream, to write at least a portion of the sequential data stream to one of the blocks, where the one of the blocks is associated with a different sequential data stream than another one of the blocks.

A further aspect of a storage device is disclosed herein. The storage device includes a non-volatile memory including a plurality of blocks, and a controller. The controller is configured to receive a plurality of host write commands, where each of the host write commands includes a sequential data stream, to write each of the sequential data streams to a different one of the blocks in response to the host write commands, and to read each of the sequential data streams respectively from the different ones of the blocks.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
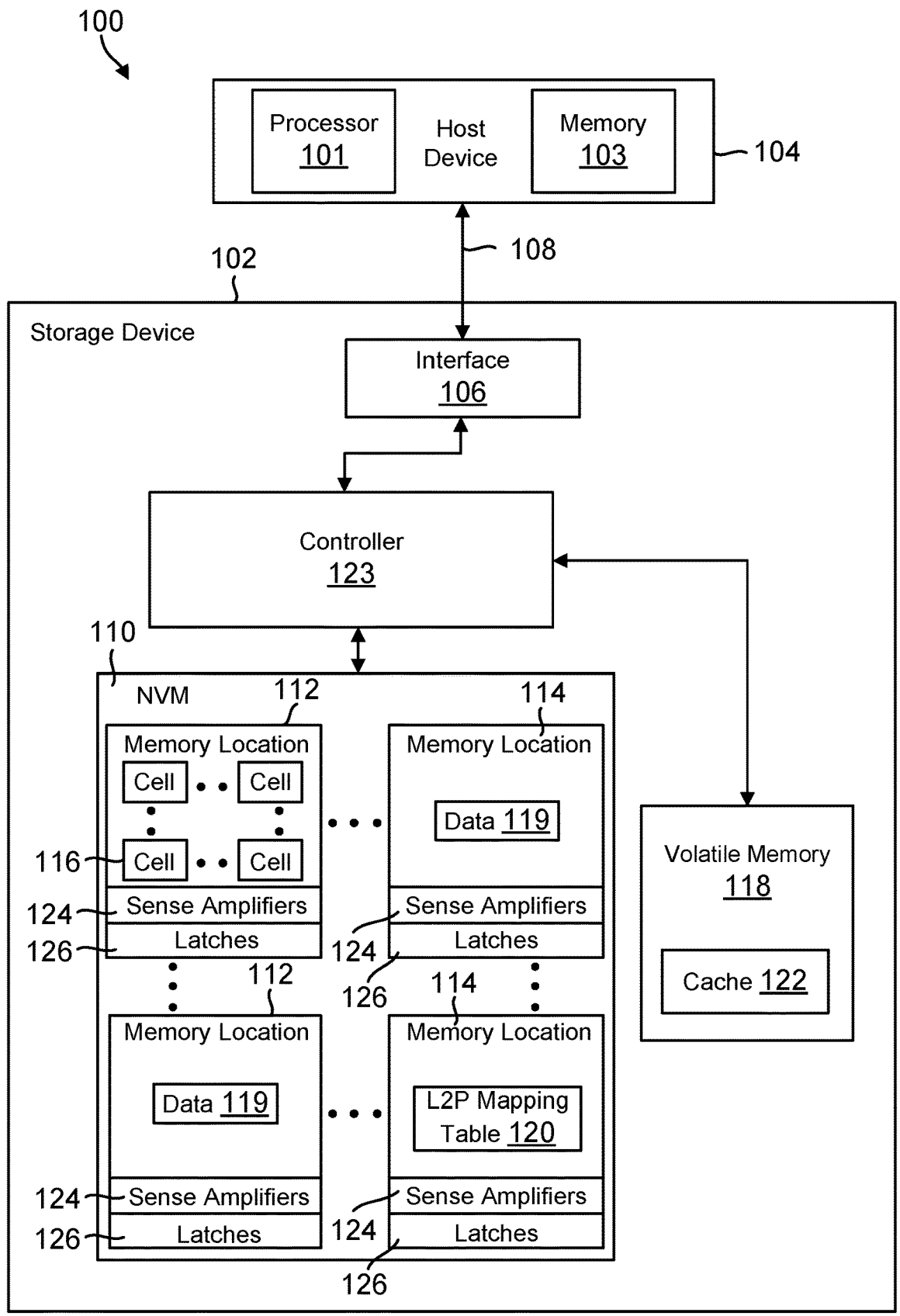
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Generally, when a controller of the storage device receives a data stream including a range of LBAs to be written to memory (e.g., in a host write command), the controller checks whether this LBA range is sequential or random. If the LBAs in the range are uncorrelated, such as having inconsecutive LBAs in an unrelated pattern (e.g., LBAs 0, 500, 70, 340, 220, etc.), the controller identifies the data stream as a random stream, and accordingly writes the random data stream to a physical block of single-level cells (SLCs) reserved for random data (a "random SLC block"). The controller writes the random data stream to the random SLC block if the block is open (e.g., not full of data); if the random SLC block is closed (e.g., full of data), the controller opens a new random SLC block and writes the random data stream to the new block.

On the other hand, if the LBAs in the range are correlated, such as having consecutive LBAs in a sequence (e.g, LBAs 0-500), the controller identifies the data stream as a sequential data stream, and accordingly writes the sequential data stream to a physical block of SLCs reserved for sequential data (a "sequential SLC block"). If the controller later receives and identifies another sequential data stream in a different LBA range (e.g., LBAs 10000-11000), the controller similarly writes that data stream to the same sequential SLC block as well. The controller may continue to write sequential data streams in this manner to the same sequential SLC block while the block is open (e.g., not full of data); if the sequential SLC block later becomes closed (e.g., full of data), the controller opens a new sequential SLC block and continues writing subsequent sequential data streams to the new block.

Figure 7:
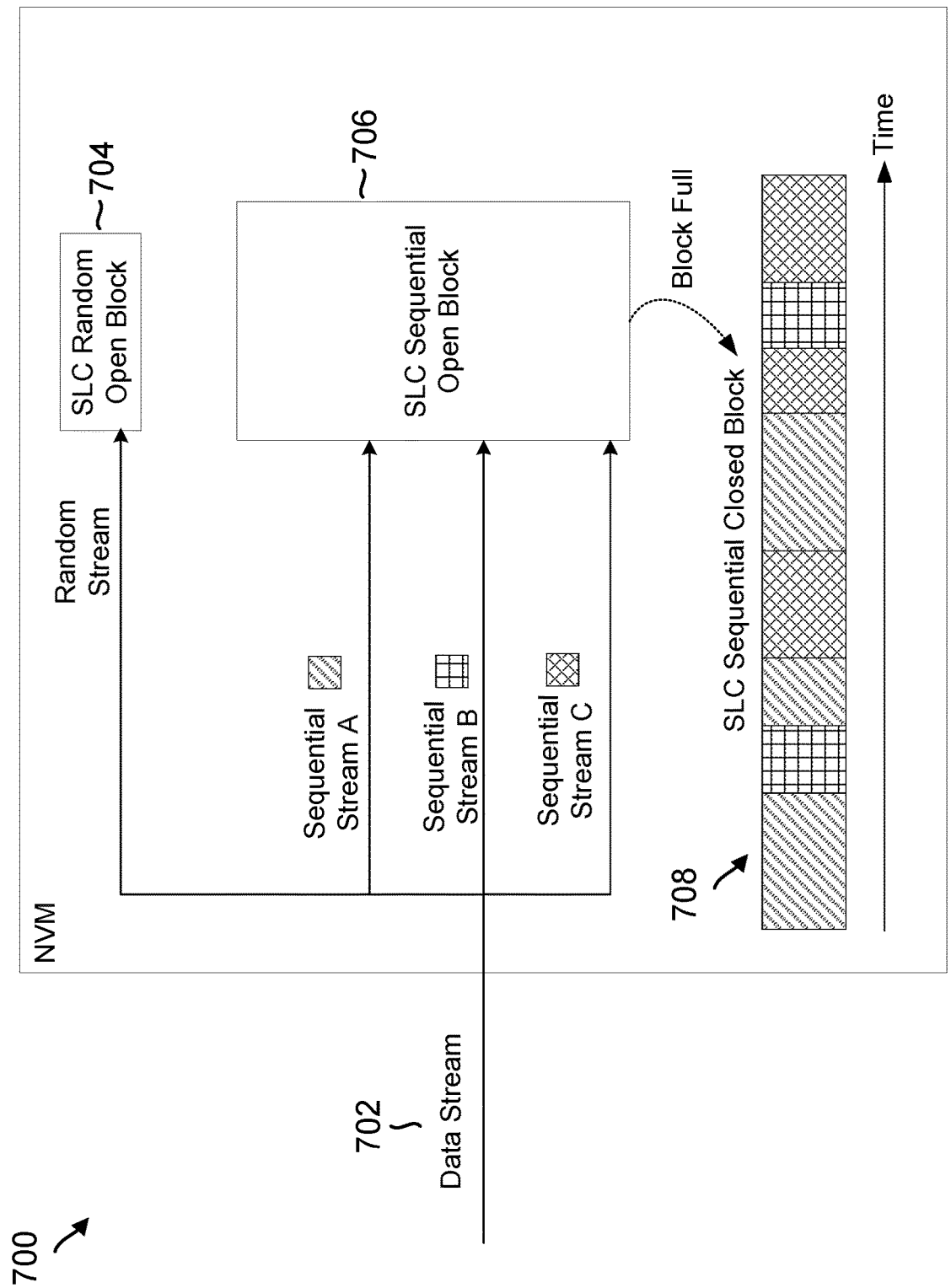
FIG. 7 is a conceptual diagram illustrating an example of a write flow for sequential and random data streams, where sequential data streams are all written to a same open block in the storage device of FIG. 1.

However, this data management scheme of writing multiple sequential data streams to a same sequential SLC block may lead to a mixed pattern of sequential data being stored in that same block. For example, if the controller of the storage device receives multiple host write commands in parallel each including a sequential data stream with different LBA ranges (e.g., LBAs 0-500, LBAs 10000-11000, etc.), the controller may store the sequential streams in the same block in an interleaved manner, such as illustrated in the example of FIG. 7. Such mixed patterns may impact sequential read performance of the storage device, since the controller may be constrained to read a sequential data stream in individual portions (due to the interleaving) rather than entirely at once from the block. Additionally, relocation performance may also be impacted by such mixed patterns. For example, to free portions of a block containing a sequential data stream that is intended for deletion, the controller may end up relocating the other sequential data streams stored in that block (in individual portions again due to the interleaving) in order to reclaim the block for subsequent data use. Moreover, storage device life may be reduced in response to these data relocations since the number of program/erase cycles (P/E) of the destination block including the other sequential data streams would increase.

Accordingly, to improve storage device management of sequential data and consequently read and write performance, the controller of the storage device may segregate sequential data streams between different physical blocks. For instance, the controller may write each of the sequential data streams to a different sequential SLC block. Alternatively, the controller may write each of the sequential data streams to a different physical block of multi-level cells (MLCs), such as triple-level cells (TLCs) or quad-level cells (QLCs), which are reserved for sequential data ("sequential MLC blocks"). The controller may write to sequential SLC blocks, for example, in a folding system where data in SLC blocks is relocated to blocks of MLCs, while the controller may write to sequential MLC blocks, for example, in a non-folding system where data is originally written to blocks of MLCs. In one example, the sequential data streams may be written in parallel to the different blocks, while in another example, the sequential data streams may be written serially to the different blocks.

The controller may write sequential data streams respectively to different sequential blocks (e.g., sequential SLC blocks or sequential MLC blocks) up to a number of supported sequential data streams of the storage device. Thus, the controller may limit the number of sequential data streams that may be written to respective physical blocks. In one example, the controller may obtain a number of sequential data streams that the storage device may support for writing in different physical blocks, as well as a number of sequential blocks that may be opened to store respective sequential data streams. The number of open sequential blocks may generally be the same as the number of supported sequential data streams. The maximum number of supported data streams or sequential blocks may be based on a host pattern of sequential data writes (e.g., an average size of received sequential data streams). Moreover, since the sequential data streams which are to be written to open blocks are temporarily stored in volatile memory (e.g., a random access memory), the maximum number of supported data streams or sequential blocks may also be based on a capability of the storage device to store the sequential data streams in the volatile memory (e.g., a RAM size). As an example, if the storage device only supports three, average-sized sequential data streams at one time in a static RAM (SRAM) (e.g., the controller has allocated 3 GB in RAM for storing sequential data streams and the controller determines based on historical data patterns that the average sequential data stream is 1 GB), the controller may be limited to opening three sequential SLC blocks at maximum (one block for each sequential data stream).

However, in some cases, the controller may support more sequential data streams or blocks than the maximum number of streams the volatile memory can support based on the host data pattern. For instance, the controller may support additional sequential data streams by utilizing dynamic SRAM handling where the controller swaps data from one sequential stream to flash memory to make room for data from another sequential stream in the SRAM. Thus, in the example above where the volatile memory only supports three sequential data streams at one time due to its size (and thus three sequential SLC blocks), the controller may effectively support more than three streams and blocks by swapping at least one of these data streams in the flash memory to provide space in the volatile memory for at least one additional sequential data stream. For example, after the controller stores each of the three aforementioned supported sequential streams in the RAM and in response to obtaining a new data stream from the host device (e.g., a fourth sequential stream), the controller may swap one of the original three data streams to the NAND and store the fourth data stream in its place in the RAM. Afterwards, the controller may open a new sequential block in the NAND to store this new (fourth) data stream. The controller may similarly open additional sequential blocks to store respective sequential data streams in this manner above the limit imposed by the volatile memory based on the host write pattern. However, even with this dynamic memory handling, the increased number of supported streams or blocks that may result is not unlimited. For instance, the number of sequential blocks the controller may open as a result of this dynamic memory handling may itself be constrained by a write amplification limit in the flash memory (e.g., a maximum number of swaps the controller may perform in the volatile memory which maintains performance at an acceptable level or which does not degrade performance below an unacceptable level).

Thus, following completion of a sequential data stream write to a sequential block, the controller may receive a new sequential data stream to be written to flash memory. If the new sequential data stream is within the number of supported sequential data streams of the storage device (e.g., effectively supported streams taking into account any dynamic memory handling if implemented), the controller may write the new sequential data stream to a sequential block respectively allocated for that data stream as previously described. However, if the new data stream exceeds the number of (effectively) supported sequential data streams in the storage device, the controller may write the new sequential data stream to a least recently used (LRU) sequential block. For instance, the controller may determine whether one of its previously allocated sequential blocks is LRU, in which case the controller may allocate the new data stream to that LRU block accordingly. As an example, if the controller only supports at most three sequential streams in respective sequential blocks, but has already received three sequential streams from the host to be written to these blocks, then this new sequential data stream may be a fourth sequential stream received from the host device. In response to receiving this fourth data stream, if the controller has already completed writing one of its three original sequential streams to a respective block, the controller may determine that this respective block is currently LRU, and therefore the controller may write the fourth sequential stream to that LRU block accordingly.

As a result, an LRU block may include sequential data from multiple data streams (e.g., an old stream allocated to that block and the new stream allocated to that block). However, since the new stream is written to the block beginning where the old stream ends (e.g., at the next adjacent page of that block), the controller may determine the boundaries of the complete old and new streams in response to the LRU write. Thus, improved sequential read performance and relocation performance may still be maintained, since the sequential block would not store a mixed pattern of stream portions interleaved across the block such as previously described but rather store complete streams adjacently within the block. If the controller determines a LRU block for a new data stream while other old data streams are still being written to their respective sequential blocks, the controller may write this new stream to the LRU block in parallel with the other data streams.

Accordingly, in an example write flow, the controller may initially check if a host write command includes sequential or random data. If the data stream in the host write command is random, the controller may write the random data stream to a random block. Otherwise, if the data stream is sequential, the controller may determine whether this data stream matches an existing sequential stream (e.g., whether a sequential block has already been allocated to this stream). For example, the controller may check whether the LBA range of the current stream matches a stored LBA range in its (effectively) supported streams. If a match exists, the controller may check if the sequential block (e.g., a relevant open block for this current stream) has enough space available to write the current stream. If enough space is available in the block, the controller writes the data stream to the sequential open block; otherwise, if the block does not have enough space available (e.g., it is full of data), the controller closes that block and selects (e.g., allocates) a new open sequential block for that stream to continue its write of the data stream. Alternatively, if the current stream does not match an existing stream (e.g., a sequential block has not been allocated to this stream), the controller may check if a maximum stream limit (e.g., a maximum number of supported data streams [including any increases due to dynamic memory handling]) has been reached in response to the current stream. If the current stream does not exceed the stream limit, the controller allocates a new open block to the stream (e.g., from a pool of sequential SLC or MLC blocks allocated for this purpose); otherwise, if the stream limit has been reached, the controller allocates an existing sequential open block which is LRU to the stream and writes the stream to that block.

As a result, the storage device of the present disclosure may achieve improved sequential read performance compared to the previously discussed data management scheme involving storage of mixed data patterns. For instance, performance may be improved since the controller may read or relocate the sequential data in an entire stream from a sequential block or from contiguous sequential blocks in a single chunk (e.g., in a single transaction or command). For example, since individual blocks are associated per sequential data stream in this data management scheme, the controller may read the entire sequential data in a stream (e.g., a whole stream range) from a sequential block or from contiguous sequential blocks in a single command. A sequential data stream may be stored in contiguous sequential blocks in the case, for example, where one block becomes full following a write with part of a sequential data stream and therefore the controller writes the rest of that data stream to another sequential block (e.g., in a beginning page of the block that is contiguous or adjacent to an ending page of the previous block). Thus, the controller may read the whole data stream across the multiple blocks in response to fewer read commands or NAND senses than in the other data management scheme.

Moreover, data relocation performance may be improved since the controller may reduce the number of data relocations performed on a sequential block compared to the previously discussed data management scheme. For instance, the controller may efficiently free a respective sequential block storing a data stream intended for deletion without performing any data relocation in that sequential block, since the other sequential data streams may already be stored in different sequential blocks. Additionally, where the sequential block stores multiple sequential data streams (e.g., in response to the block storing an old data stream becoming LRU and thus being utilized for a new data stream), the controller may read or relocate an entire data stream at once from the block based on the ascertainable boundary between the complete streams. For instance, the controller may ascertain where each complete stream begins and ends in the LRU block as a result of this data management scheme, and therefore the controller may conveniently relocate an entire stream including valid data from the block before removing the invalid data from that block.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
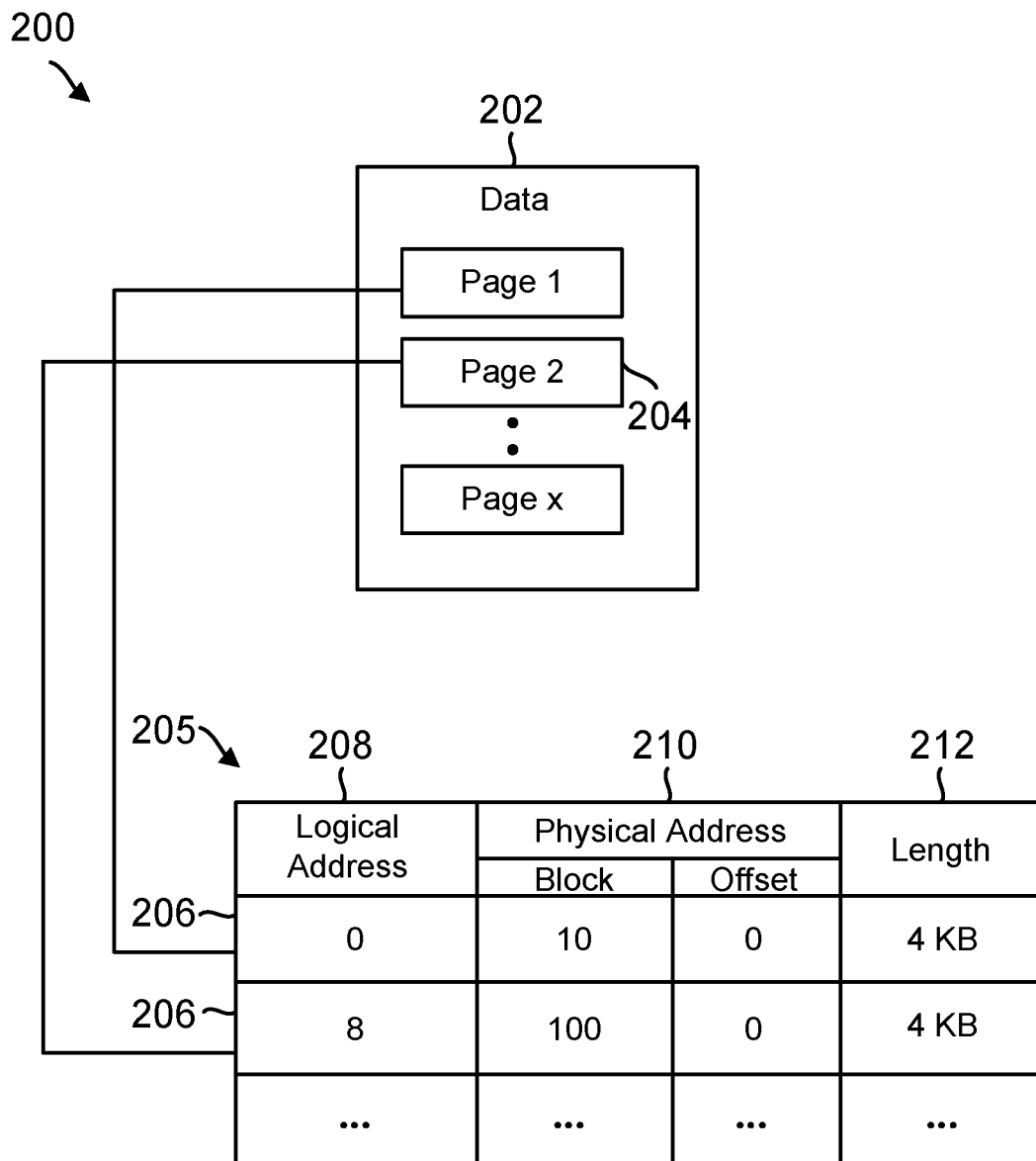
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
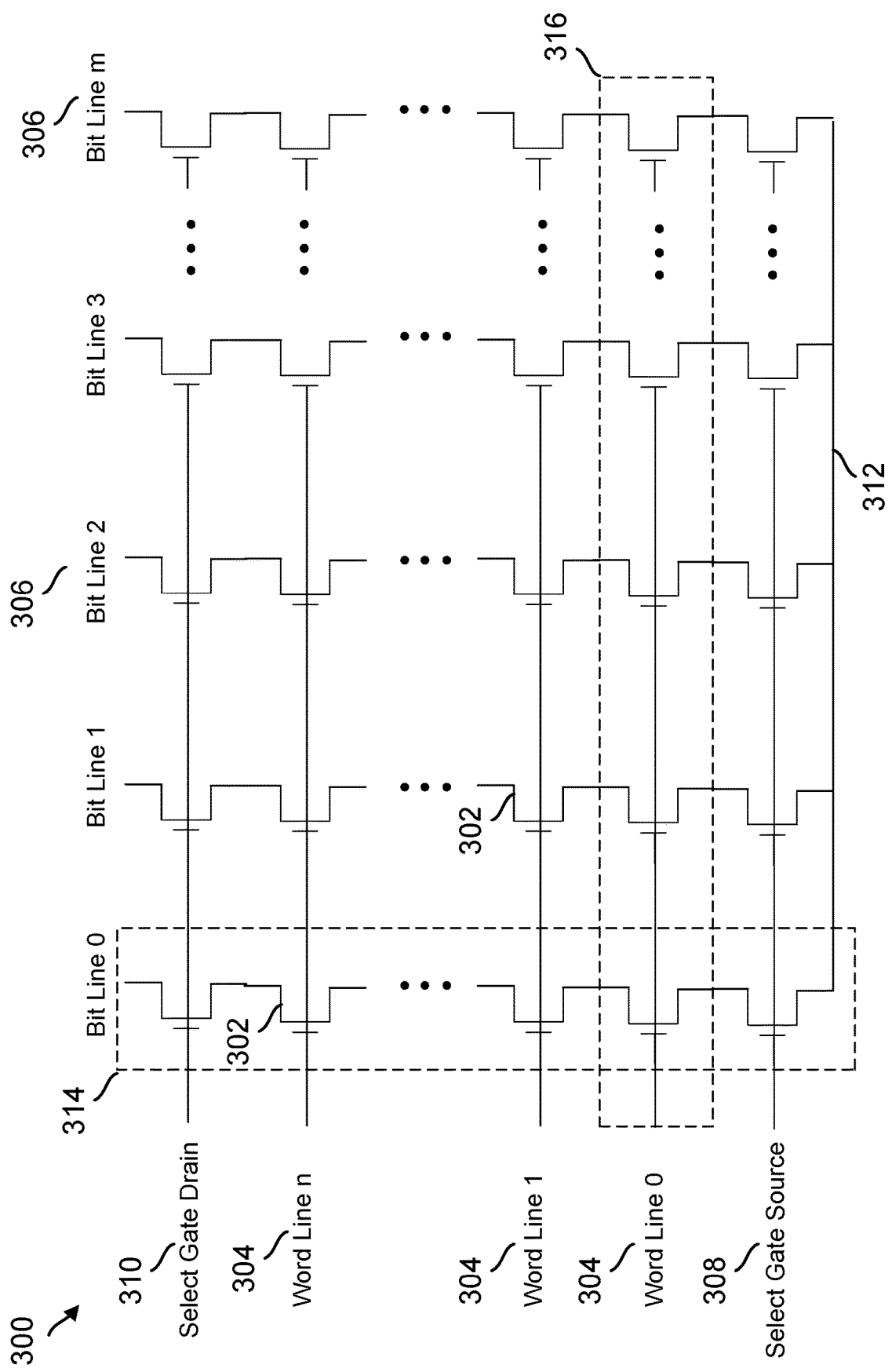
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
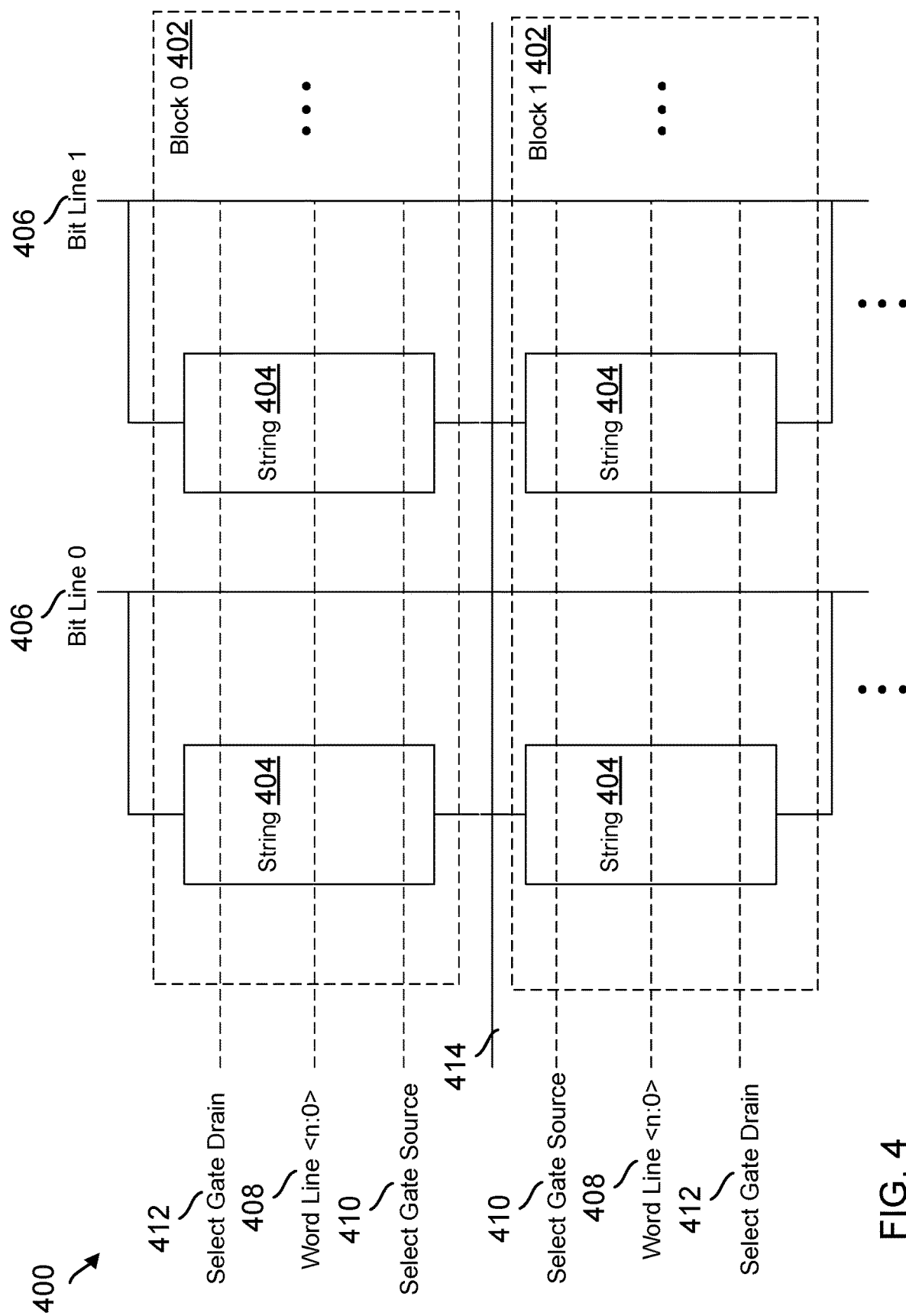
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
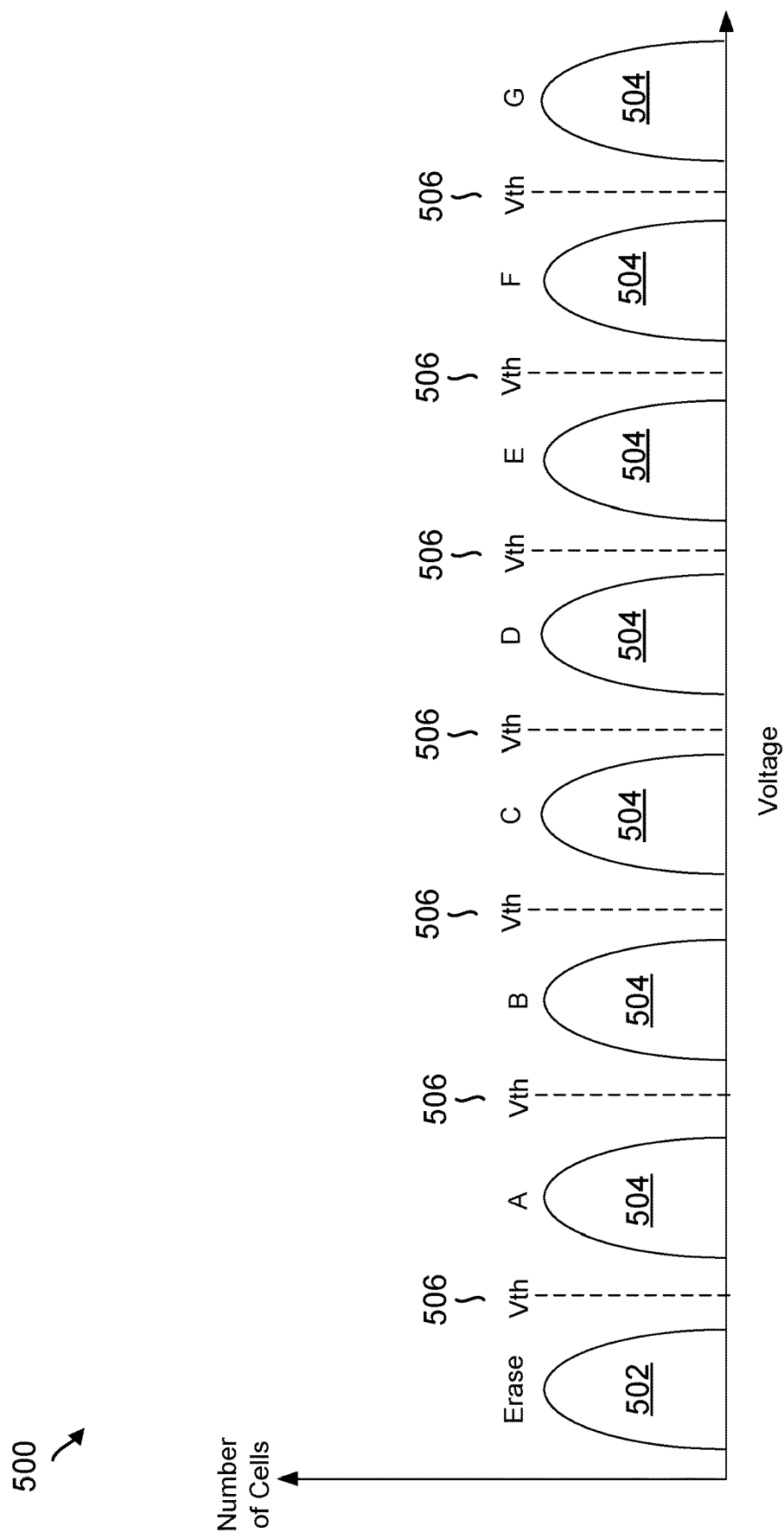
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6:
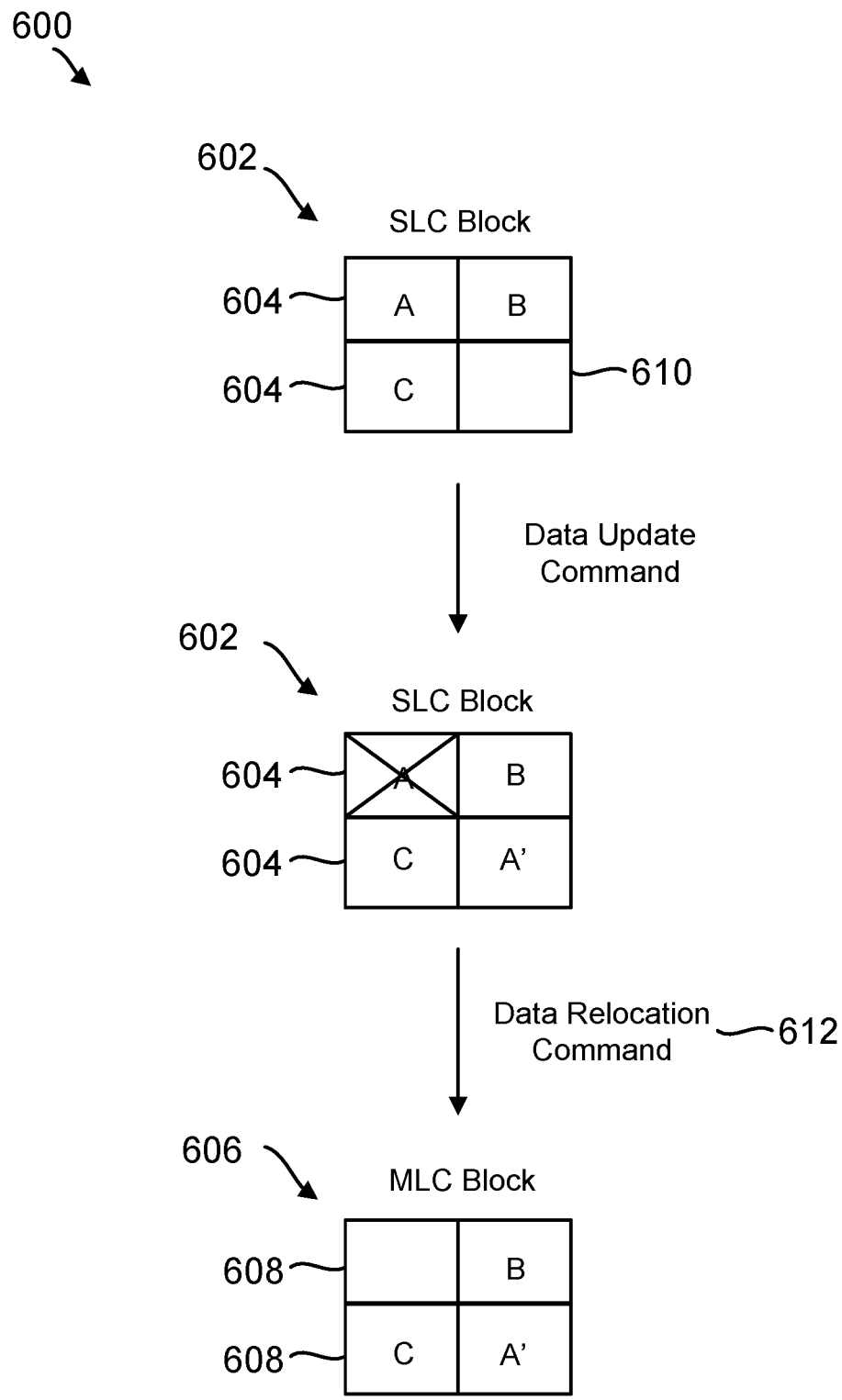
FIG. 6 is a conceptual diagram illustrating an example of a data relocation process that may be implemented in the storage device of FIG. 1.

FIG. 6 is a conceptual diagram 600 of an example of a data relocation process in which data stored in pages 604 of a block 602 of SLC cells are relocated to pages 608 of a block 606 of MLC cells. The data may correspond to the data 119 of FIG. 1, the blocks 602, 606 may correspond to the blocks 402 of FIG. 4, and the SLC/MLC cells may correspond to the cells 116, 302 of FIGS. 1 and 3. Each page 604, 608 includes data stored in multiple cells along a same row or word line (e.g. word line 304, 408) of the NVM. Thus, each page 604 may include data stored in a row of the cells 116 of one block, while each FMU 608 may include data stored in a row of the cells 116 of another block. For simplicity of illustration, the example of FIG. 6 illustrates the blocks 602, 606 each including only four pages. However, it should be recognized that each block may include any number of pages.

In the example of FIG. 6, data represented by identifiers A, B, and C are stored in different pages 604 of the block 602. Originally, the data A, B, and C are stored in three pages of the block 602 in response to write commands from the host device, leaving one of the pages free in this example. When the storage device receives new or updated data, this data is stored in the free page 610. For example, updated data A' may be received from the host device and written to the free page 610. Since data cannot be overwritten in flash memory, the invalid data A remains stored in the block 602. As a result of new data and invalid data, the block 602 may quickly become full.

To free space in the SLC block, the controller 123 may issue a data relocation command 612. In response to the data relocation command, original and updated data in the block 602 may be transferred to the block 606. The invalid data remain in the old block. For instance, in the example of FIG. 6, the original data B and C and the updated data A' are read from the pages 604 of the block 602 and written to one or more pages 608 of the block 606. The invalid data A remains in the block 602. When the block 602 is subsequently erased, the invalid data is discarded, and the block 602 may be reused to store new data.

FIG. 7 illustrates an example 700 of a write flow for sequential and random data streams from a host device. When the controller receives a write command including a data stream 702 from a host device, the controller checks whether the data stream is random or sequential. If random, the controller directs the random stream to an open random block 704, such as the SLC random block illustrated in FIG. 7. If sequential, the controller directs the sequential data stream to an open sequential block 706, such as a MLC sequential block in a non-folding system or an SLC sequential block in a folding system (such as illustrated in FIG. 7). In the latter case, the controller may later fold or relocate this data from the SLC sequential block to an MLC sequential block to save memory space.

Generally, the controller writes multiple sequential data streams to the same sequential block. Moreover, if the controller receives multiple sequential data streams with different LBA ranges in parallel from the host device, the controller may write these data streams in an interleaved manner to the same physical block. As a result, a mixed data pattern 708 such as shown in FIG. 7 may arise in the sequential block. Such mixed data patterns may lead to a reduction in sequential read performance and storage device life as previously described. For instance, in the example of FIG. 7, after the controller receives sequential streams A, B, C in parallel from the host device, the controller may write these streams in interleaved fashion to the open sequential block 706, causing the block to become full with the mixed data pattern 708 and thus lead to the controller closing the block to prevent future writes. The mixed data pattern 708 illustrated in FIG. 7 is one example of a possible mixed data pattern; in other examples, the mixed data pattern may change depending on the number and size of sequential streams received in parallel from the host device. Moreover, a mixed data pattern may result even if the sequential streams are received serially from the host device, since the controller generally stores the streams in the same open block notwithstanding whether the streams are received in parallel or serially from the host device. Additionally, in a folding system where the data streams are relocated from the SLC sequential block to an MLC sequential block, a similar mixed pattern may result in the MLC sequential block. Thus, sequential read performance and storage device life may be impacted by the occurrence of mixed patterns of data caused by allocating the same sequential block for all sequential streams notwithstanding whether the mixed pattern results from parallel host writes, serial host writes, or relocation writes.

Figure 8:
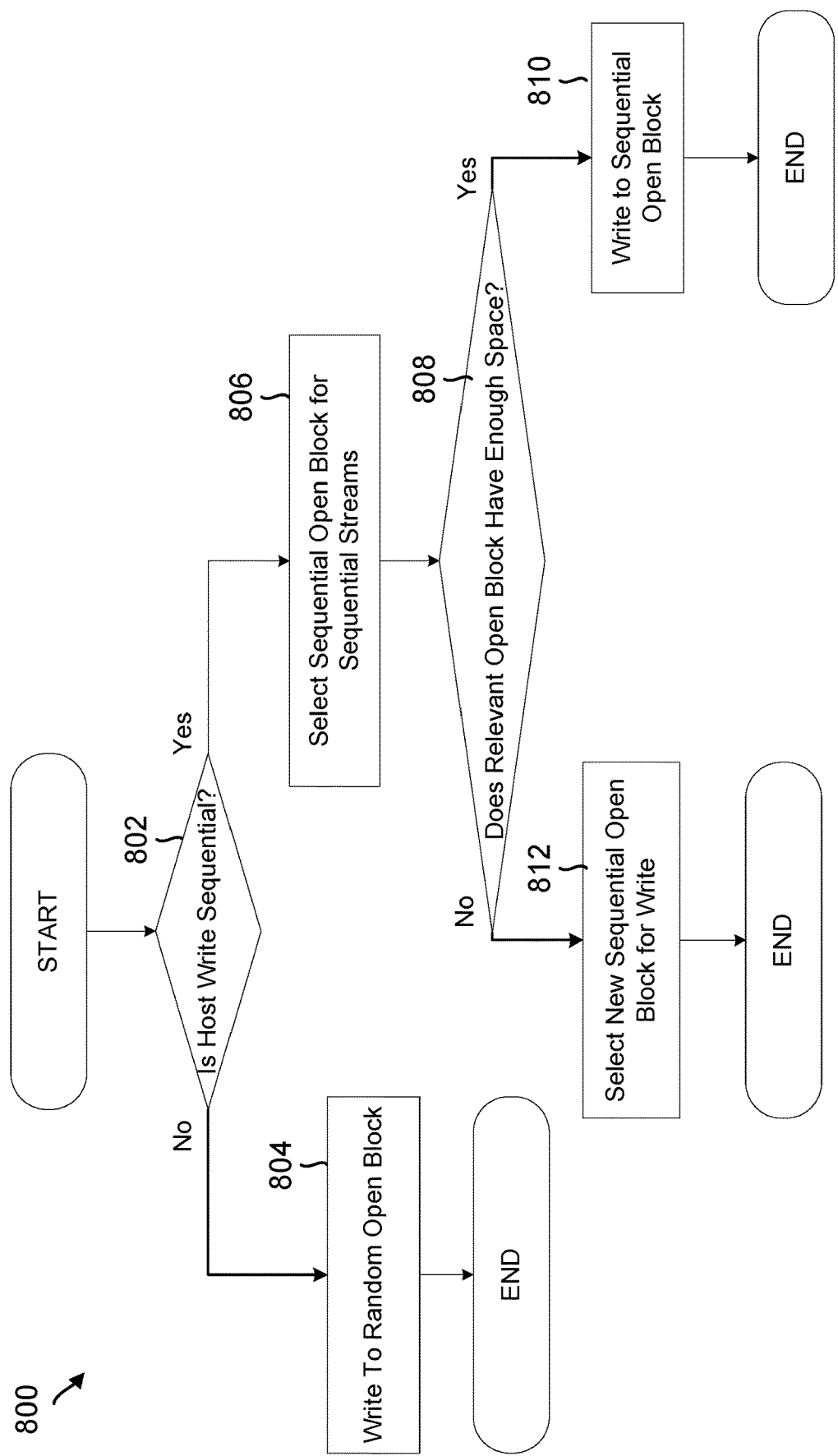
FIG. 8 is a flow chart illustrating an example of a method for writing a data stream, where sequential data streams are all written to a same open block, as performed by the storage device of FIG. 1.

FIG. 8 illustrates an example flowchart 800 of a method the controller generally performs for writing sequential and random data streams from a host device. When the controller receives a data stream (e.g., data stream 702 of FIG. 7), at block 802 the controller checks whether the data stream is random or sequential. If random, then at block 804, the controller writes the random data stream to a random open block (e.g., open random block 704 of FIG. 7). Otherwise, if sequential, then at block 806, the controller selects a single sequential open block which is relevant (e.g., allocated) for writing sequential data streams (e.g., open sequential block 706 of FIG. 7), and at block 808, the controller checks whether this relevant open block has enough space for storing at least a portion of the current stream. For instance, a chunk of the current stream (e.g., 256 or 512 KB or other transaction size amount) may be compared against the available space remaining in the open block. If enough space exists (e.g., the block is open), then at block 810, the controller writes the current portion of the sequential stream to that open block. Otherwise (e.g., the block is full or closed or otherwise does not have enough space), then at block 812, the controller opens another sequential block generically for sequential data streams and writes the current portion of the sequential stream to that newly opened block. Thus, in this implementation, only one sequential block is open at a time for writing sequential streams. Moreover, a mixed pattern of sequential data (e.g., mixed data pattern 708 of FIG. 7) may be stored in the sequential block, impacting read performance and storage device life.

Figure 9:
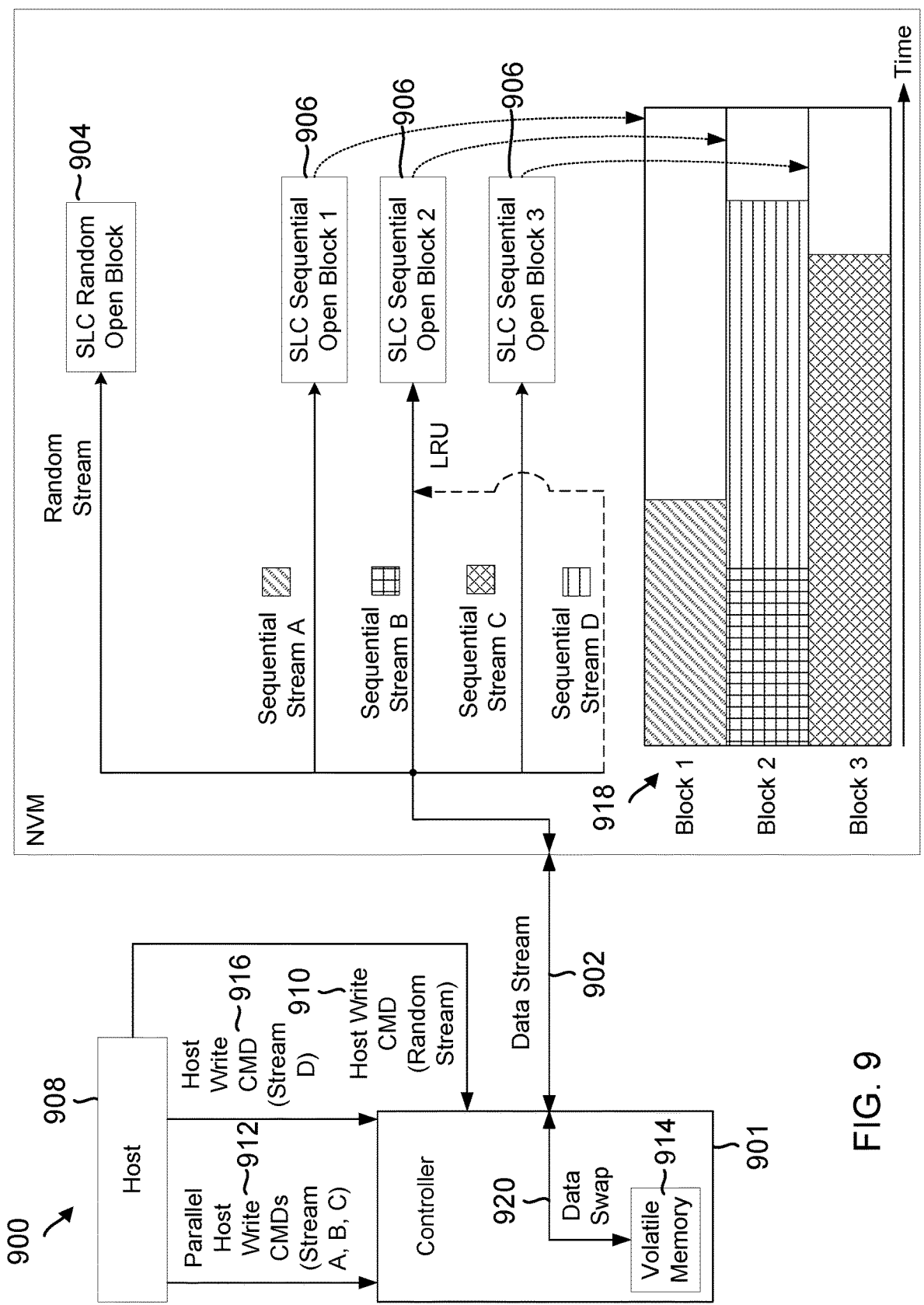
FIG. 9 is a conceptual diagram illustrating an example of a write flow for sequential and random data streams, where sequential data streams are written to different open blocks in the storage device of FIG. 1.

FIG. 9 illustrates an example 900 of a write flow for sequential and random data streams from a host device which may improve read performance and storage device life at least in part by supporting multiple open blocks for sequential streams. Similar to the example 700 of FIG. 7, a controller 901 may direct a data stream 902 to either a random open block 904 or a sequential open block 906 (e.g., SLC or MLC) depending on whether the data stream is random or sequential. However, in this example, the controller may route sequential data streams respectively to different sequential open blocks. For instance, the controller may receive from a host device 908 a host write command 910 including a random data stream which the controller may write to a SLC random open block, and the controller may receive from the host device a plurality of parallel host write commands 912 (e.g., sequential streams A, B, and C) which the controller may write respectively to different SLC sequential open blocks (e.g., SLC sequential open block 1, 2, and 3).

A number of the sequential open blocks 906 may depend on a number of sequential data streams supported by the controller 901 of the storage device. For instance, in the example of FIG. 9, the controller may include a volatile memory 914 which only supports three sequential streams (based on an average size of historical sequential data streams and a size of the volatile memory), and therefore the controller may allocate three sequential open blocks respectively for received sequential data streams. Sequential data in three different streams may therefore be segregated respectively in three physical blocks in this example. If the controller receives more sequential data streams than the controller supports in sequential open blocks, the controller may route these additional sequential data streams to LRU blocks. For instance, in the example of FIG. 9, in response to receiving a host write command 916 including an additional sequential data stream (e.g., sequential data stream D), the controller may route this stream to whichever one of the sequential open blocks 906 is LRU. The LRU block may be a block in which a previous sequential data stream has been completely written prior to reception of the additional sequential data stream. For instance, as illustrated by data pattern 918 of sequential open blocks in the example of FIG. 9, sequential stream B has been completely written to SLC sequential open block 2 by the time the controller processes the host write command 916 including sequential data stream D, resulting in that sequential open block being LRU and therefore becoming the target block for sequential data stream D.

Therefore, by segregating sequential data of different streams respectively between multiple open sequential blocks, data relocation may be facilitated and read performance improved. For instance, in the example of FIG. 9, if sequential stream A in SLC sequential open block 1 later became invalidated due to a data overwrite or update, the controller 901 may be able to release that open block without having to relocate valid data for other sequential data streams in that same block because sequential stream A may be the only sequential data stream stored in the block. This reduction in data relocations would in turn reduce write amplification, leading to improved storage device life. In contrast, in the example of FIG. 7, such benefit may not be achieved due to the mixed pattern of data from different sequential streams being stored in the same block, and the controller would end up inefficiently relocating valid data from other streams such as described with respect to FIG. 6. Additionally, the controller may be able to read the entirety of sequential stream A from the SLC sequential open block 1 in fewer NAND senses than in the example of FIG. 7 due to the lack of intermingling of data with other streams in that same block, resulting in improved read performance.

In an example operation, the controller 901 may initially allocate a physical block to each supported sequential data stream. For instance, the controller may configure a mapping table indicating sequential stream A (with one LBA range) is associated with SLC sequential open block 1, sequential stream B (with another LBA range) is associated with SLC sequential open block 2, and sequential stream C (with a further LBA range) is associated with SLC sequential open block 3. As the controller receives the data streams in parallel from the host device 908 (e.g., in parallel host write commands 912), the controller may write portions or chunks of each data stream to their respective sequential blocks (e.g., one transaction size at a time). For instance, the controller may compare the LBAs of each data stream with the mapping table to determine the associated sequential open block, and the controller may write the data streams portion by portion to their respective blocks. When new data streams are received from the host device (e.g., in host write command 916), the controller may allocate LRU blocks accordingly in which the new data streams are similarly written portion by portion. For instance, the controller may reconfigure the mapping table to indicate sequential stream D (with another LBA range) is associated with SLC sequential open block 2 due to that block being LRU.

Due to volatile memory size constraints, the controller may generally not allocate a new open block for each received sequential data stream. Therefore the controller may limit the number of open sequential blocks according to the maximum number of sequential data streams the controller may support. The number of supported sequential data streams or open sequential blocks may be based on a historical pattern of sequential host writes as well as storage device capability (e.g., a size of the volatile memory 914 allocated for sequential writes). The maximum number of blocks that the controller may open for sequential data streams may be the same as, or in some cases more than, the maximum number of supported streams. The number of blocks opened for sequential data streams may exceed the number of supported data streams, for example, when the controller performs data swaps 920 of existing streams to the non-volatile memory (e.g., in dynamic memory handling). The data swaps allows the controller to effectively increase the fixed space in the volatile memory 914 for sequential open blocks. For example, if a first data stream/block occupies one amount of volatile memory and a second data stream/block occupies the same amount of non-volatile memory, then when the first stream/block is unused, the controller may swap the first stream/block out of the volatile memory into non-volatile memory, and the second stream/block may be brought in place into the volatile memory. Thus, in a variation of the example of FIG. 9 where the volatile memory 914 allows support for at most three open blocks at a time (streams A, B, and C) but the controller intends to allocate a fourth block for stream D, the controller may swap stream B into the NAND (e.g., since that stream is unused at the time stream D is processed) and utilize its volatile memory space for writing stream D to a new open block. The controller may perform similar such data swaps and increase the number of open blocks respectively associated with each stream until a write amplification limit is reached. The write amplification limit prevents or minimizes any excessive NAND stress which may result from any metadata and data that the controller writes to the NAND with each data swap.

When the controller obtains a quantity of sequential data streams exceeding the maximum number supported, the controller may allocate any of the existing open blocks which are LRU to those new sequential data streams exceeding the supported quantity. For each of these new sequential streams, the controller may check a history of sequential writes to determine which sequential block is currently LRU, and the controller may write the new sequential stream to that LRU block accordingly. Thus, in the example of FIG. 9, after sequential stream B was completely written to SLC sequential open block 2 and that block became LRU, sequential stream D may also be written to SLC sequential open block 2, resulting in that block having data from both sequential streams.

The controller may write new sequential streams (e.g., sequential stream D) to LRU blocks, rather than create new blocks for these streams or write to other sequential blocks, for various reasons. First, the storage device does not have unlimited resources, so mapping an unlimited number of open blocks respectively to each new sequential stream received from a host device is infeasible. As a result, LRU blocks that were previously utilized for storing sequential streams may be applied.

Second, when the controller receives host write commands with sequential streams and stores them in a same sequential block, there is generally no indication or marker informing the controller of the boundaries of the different streams. For instance, in the example of FIG. 7 where a single sequential block may include mixed data pattern 708 of sequential streams, the controller may not easily determine from one portion of a stream whether other portions of that stream precede or follow that portion (due to those portions being interleaved with other data stream portions). However, by storing multiple sequential streams in a LRU block, an indication or marker informing the controller of the different stream boundaries within that block may effectively be provided. For instance, in the example of FIG. 9 where sequential stream D is written to SLC sequential open block 2 after sequential stream B has completed being written and thus SLC sequential open block 2 has become LRU, the controller may easily determine where in the block the entire sequential stream B ends and where the entire sequential stream D begins. Thus, the controller may store multiple streams in a single block more efficiently than in the example of FIG. 7. As a result of this indication or marking of stream boundaries, data relocation and reads may be more efficiently performed, since the controller may be able to read or relocate an entire stream range at once rather than in multiple LBA sub-ranges (due to a mixed pattern situation such as in the example of FIG. 7).

Third, an LRU status of a sequential block indicates that block is the oldest (farthest back in time) block previously utilized for storing a sequential data stream. Thus, in the example of FIG. 9, at a time that host write command 916 including sequential stream D is processed, if a write was last performed to SLC sequential open block 1 ten minutes prior, to SLC sequential open block 2 fifteen minutes prior, and to SLC sequential open block 3 five minutes prior, SLC sequential open block 2 would be the LRU block among these sequential blocks (since the write had completed for that block the farthest back in time or the block was unused the longest amount of time). Stated another way, a LRU block may refer to a physical block associated with the lowest timestamp for a write. For instance, considering a timescale which starts from 0 units and proceeds in an increasing direction of time, if SLC sequential open block 1 had a timestamp of 400 units (i.e., block 1 was last written at time 400), SLC sequential open block 2 had a timestamp of 300 units (i.e., block 2 was last written at time 300), and SLC sequential open block 3 had a timestamp of 500 units (i.e., block 3 was last written at time 500), and sequential stream D has begun processing at a current timestamp of 510 units, then SLC sequential open block 2 would be the LRU block since it has the lowest timestamp (or the maximum difference in time among the blocks from the current timestamp).

Thus, the timestamps considered for LRU blocks may allow the controller to easily determine the indication or marking of a boundary between one data stream and another data stream in the same sequential block. For instance, the controller may determine this boundary from the difference in timestamps between one data stream and the next (e.g., the difference in the timestamp of 300 units in SLC sequential open block 2 for sequential stream B and the timestamp of 510 units in that same block for sequential stream D). These timestamps may also allow the controller to avoid writing a new sequential stream to a block currently being written with another sequential stream, which thereby avoids another mixed pattern situation such as described above with respect to FIG. 7 from arising. For instance, in the timestamp example above, if the controller decided instead to write sequential data stream D to SLC sequential open block 3 with its latest timestamp of 500 units, the controller may end up writing to the block at the same time that sequential data stream C is still being written to the SLC sequential open block, resulting in possible interleaving of data portions between the different streams similar to that shown in FIG. 7. However, by writing to the LRU block instead, the controller may avoid such a situation and the impact to performance that such situation would cause.

As another example for purposes of illustration, assume that the controller receives host write commands to write three sets of data (e.g., streams or files) in parallel, where the first stream has 1 GB, the second stream/file has 500 MB, and the third file has 100 MB. After the controller writes 100 MB of all three files in parallel to their respective sequential blocks, the third stream will complete and that block becomes unused. During this time, the writing to the other two blocks may continue until 500 MB is written, at which point the second stream will be complete, and then afterwards 1 GB is written, at which point the first stream will be complete. However, if a fourth stream is received, for example, after 200 MB of data has been written from the other streams, and the controller intends to write the fourth stream to one of the existing sequential blocks to save resources, the controller may determine that the block associated with the 100 MB third file had finished some time before and is therefore LRU, and thus the controller may write the fourth stream to that block accordingly. As a result, the controller may avoid writing the fourth stream to the first or second blocks, which are still being used to write the other streams in this example, since writing the fourth stream to either of these blocks would result in a mixed data pattern such as illustrated in FIG. 7 with its associated inefficiencies.

Figure 10:
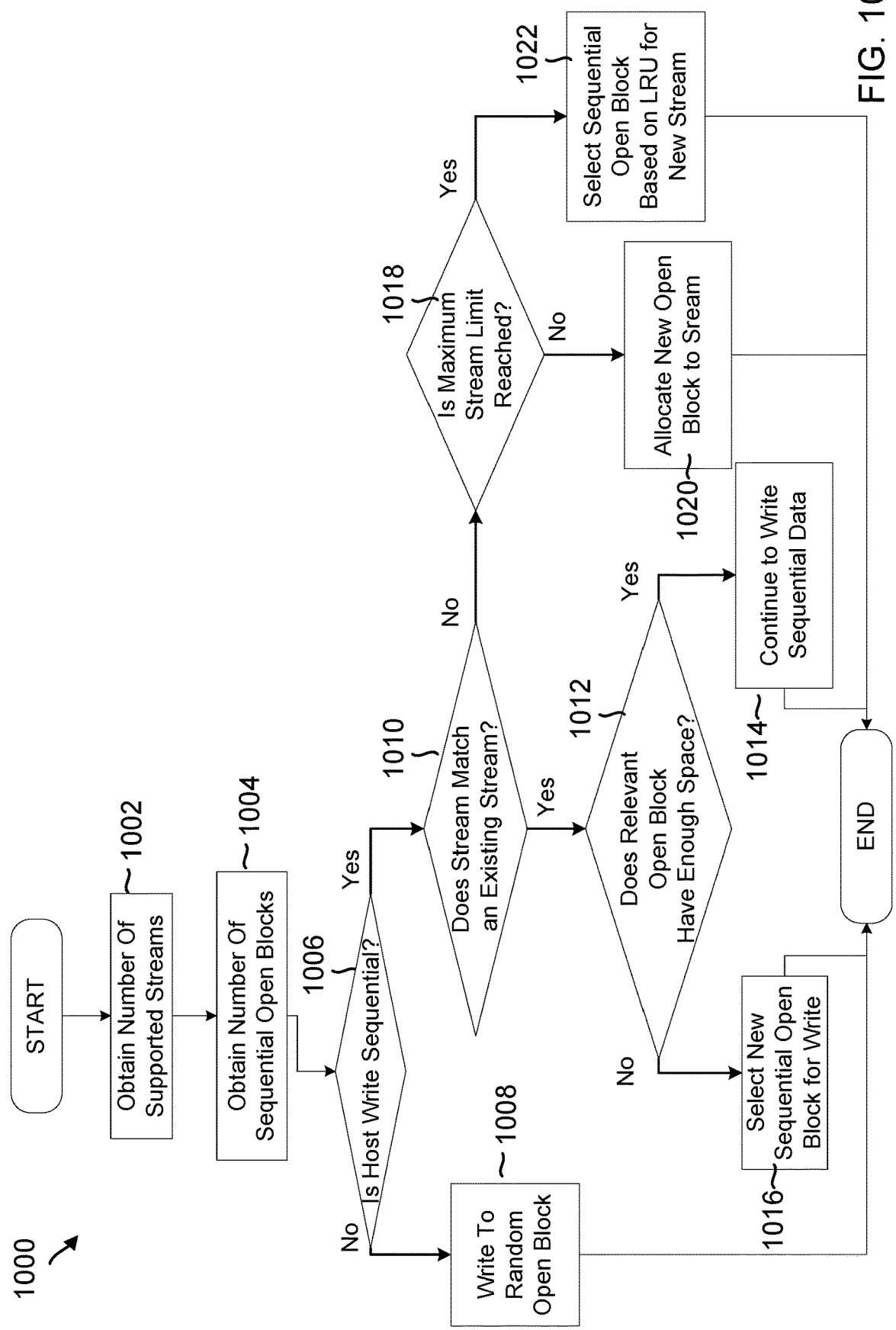
FIG. 10 is a flow chart illustrating an example of a method for writing a data stream, where sequential data streams are written to different open blocks, as performed by the storage device of FIG. 1.

FIG. 10 illustrates an example flow chart 1000 of a method for writing a data stream, where sequential data streams are written to different open blocks. For example, the method can be carried out in a storage device 102 such as the one illustrated in FIG. 1. Each of the steps in the flow chart can be controlled using the controller as described below (e.g. controller 123, 901), by a component or module of the controller, or by some other suitable means.

As represented by block 1002, the controller obtains the number of supported streams for the storage device, and as represented by block 1004, the controller obtains a number of sequential blocks to be opened for respective sequential streams. The number of sequential open blocks may be based on the number of supported streams. For example, the number of blocks may generally be the same as the number of supported streams. The controller may determine the number of supported streams or number of open blocks based on a host write pattern of sequential data streams, and a size of the volatile memory allocated for writing sequential data streams. For instance, the controller may check its RAM constraint and the size of each stream on average that the controller receives. As an example, if the controller only has 3 GB of RAM allocated for this purpose, and the average size of each stream is 1 GB, the controller may determine that it can only support 3 streams. Afterwards, the controller may determine to open 3 sequential blocks to respectively allocate to each stream.

In some cases, the number of blocks obtained at block 1004 may be different than the number of supported streams obtained at block 1002. For instance, when determining the number of blocks to open based on a host write pattern and volatile memory size, the controller may also factor the number of data swaps the controller may perform into the determination. The number of data swaps may be subject to a write amplification limit. For instance, in the example of FIG. 9 where the controller supports a maximum of three sequential streams at one time (e.g., streams A, B, and C), the controller may determine at runtime whether to open three sequential blocks (e.g., SLC sequential open blocks 1, 2, and 3), or four sequential blocks (e.g., a different block respectively for each stream, in response to a data swap of one of the three aforementioned streams). The controller may also choose to downgrade its number of open blocks to be less than its maximum number of supported streams. For instance, even if the controller is capable of supporting three sequential streams in volatile memory 914 as illustrated in FIG. 9, the controller may choose to only open two blocks at one time (and thus effectively support only two streams at a time, with one block for each stream).

As represented by block 1006, the controller determines whether a current data stream in a host write is random or sequential. If random, then as represented by block 1008, the controller writes the random data stream to a random open block (e.g., random open block 904 of FIG. 9). Otherwise, if sequential, then as represented by block 1010, the controller checks whether the current data stream matches an existing sequential stream in the storage device. For instance, the controller may check a mapping table indicating whether a given LBA range of the current data stream is within a stored LBA range of an existing sequential stream. The indication may be placed in the mapping table, for example, in response to the steps taken at block 1020 below. If there is a match, then as represented by block 1012, the controller may check whether a sequential open block which is relevant (e.g., allocated) for writing that existing sequential stream (e.g., one of the sequential open blocks 906 of FIG. 9) has enough space for storing at least a portion of the current stream. For instance, a chunk of the current stream (e.g., 256 or 512 KB or other transaction size amount) may be compared against the available space remaining in the open block. If enough space exists (e.g., the block is open), then as represented by block 1014, the controller may write the current portion of the sequential stream to that open block. Otherwise (e.g., the block is full or closed or otherwise does not have enough space), then as represented by block 1016, the controller may open another sequential block respectively for that sequential data stream and write the current portion of the sequential stream to that newly opened block.

On the other hand, if at block 1010, the controller determines that the current data stream does not match an existing sequential stream in the storage device (e.g., the current data stream includes the beginning of a sequential stream), then as represented by block 1018, the controller may check whether the current data stream exceeds a maximum stream limit (a maximum number of supported sequential streams including any increases due to dynamic memory handling). If not, then as represented by block 1020, the controller may allocate one of its open sequential blocks to write the current data stream. For instance, the controller may associate the current data stream with the open sequential block in a mapping table. The controller may then write the current portion of the data stream to the allocated block. Otherwise, if the current data stream does exceed the maximum stream limit, then as represented by block 1022, the controller may select one of the existing sequential blocks which is LRU. For instance, the controller may check the timestamp recorded for a last write performed in each of the sequential blocks, and compare that timestamp against a current timestamp to determine the block having the longest timestamp difference. In response to identifying the LRU block, the controller may allocate the LRU block (e.g., in the mapping table) and write the current portion of the data stream to that block accordingly.

Figure 11:
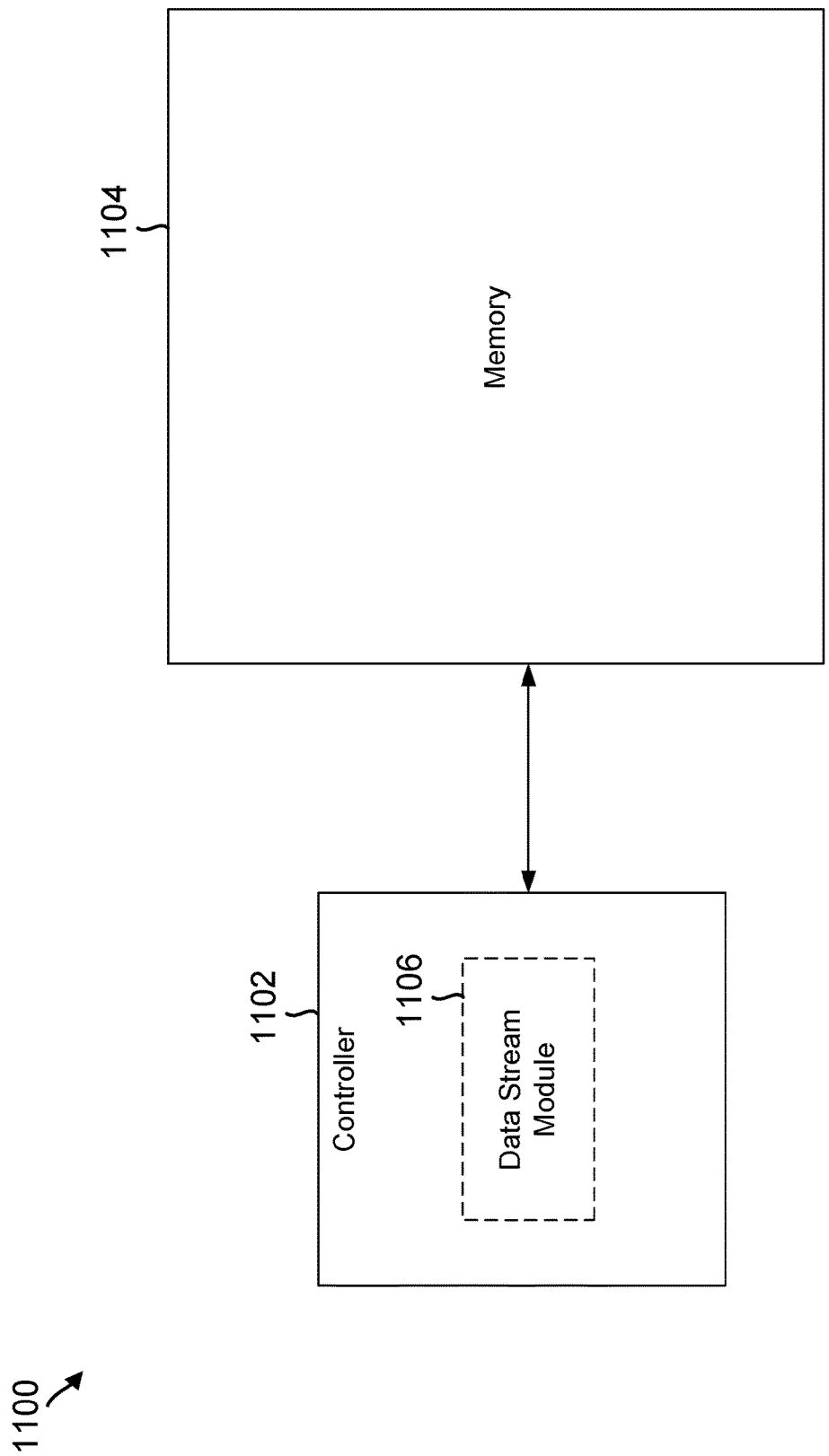
FIG. 11 is a conceptual diagram illustrating an example of a controller that writes sequential data streams to different open blocks in the storage device of FIG. 1.

FIG. 11 is a conceptual diagram illustrating an example 1100 of a controller 1102 coupled to a memory 1104 in a storage device. For example, controller 1102 may correspond to controller 123, 901 and memory 1104 may correspond to the NVM 110 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1102 includes a data stream module 1106 that may provide a means for writing a plurality of sequential data streams respectively to different blocks. For example, the data stream module 1106 may perform the process or algorithm described above with respect to FIG. 10.

In one example, the storage device 102 includes a non-volatile memory (e.g., NVM 110) including a plurality of blocks (e.g., blocks 402, sequential open blocks 906); and a controller (e.g., controller 123, 901) configured to receive a plurality of parallel host write commands (e.g., parallel host write commands 912), each of the parallel host write commands including a sequential data stream (e.g., streams A, B, C), and to write each of the sequential data streams to a different one of the blocks in response to the parallel host write commands (e.g., as illustrated in the example of FIG. 9).

In one example, the controller is further configured to obtain a maximum number of sequential data streams to be allocated to individual ones of the blocks (e.g., a maximum number of open blocks such as described above with respect to block 1004, or a maximum number of supported streams or maximum stream limit such as described above with respect to block 1002), and wherein the controller is further configured to write the sequential data streams to the different ones of the blocks in response to a number of the sequential data streams being at most equal to the maximum number of sequential data streams (e.g., such as in the example of FIG. 9, where the controller may support three sequential streams at maximum in its volatile memory 914 and thus may write streams A, B, and C respectively to different sequential open blocks).

In one example, the storage device may include a volatile memory configured to store the sequential data streams (e.g., volatile memory 118, 914), wherein the maximum number of sequential data streams is based on a host write pattern (e.g., an average size of each sequential data stream in a number of previous or historical data streams) and a size of the volatile memory (e.g., allocated for storing sequential data streams to write to the NVM).

In one example, the maximum number of sequential data streams (e.g., obtained at block 1002 or 1004) is further based on a write amplification limit for sequential data swaps (e.g., data swaps 920) between the volatile memory (e.g., volatile memory 914) and the non-volatile memory (e.g., NVM 110).

In one example, the controller is further configured to receive another host write command (e.g., host write command 916) including another sequential data stream (e.g., stream D), to determine a LRU block from the different ones of the blocks (e.g., sequential open block 2 in the example of FIG. 9), and to write the another sequential data stream to the LRU block in response to the determination.

In one example, the LRU block indicates an end of one of the sequential data streams and a beginning of the another sequential data stream (e.g., such as illustrated in the data pattern 918 of FIG. 9 for block 2).

In one example, the controller is further configured to write the another sequential data stream to the LRU block while other ones of the sequential data streams are being written in parallel to the non-volatile memory (e.g., such as illustrated in the data pattern 918 of FIG. 9, which shows that at least a portion of sequential stream D is written at the same time as a portion of sequential stream A to block 1 and sequential stream C to block 3)

In one example, the storage device includes a non-volatile memory including a plurality of blocks; and a controller configured to receive a host write command (e.g., one of the parallel host write commands 912), to determine whether the host write command includes a sequential data stream (e.g., stream A such as described above at block 1006), and in response to determining the host write command includes the sequential data stream, to write at least a portion of the sequential data stream to one of the blocks (e.g., such as described above at block 1014 and illustrated in the example of FIG. 9), wherein the one of the blocks (e.g., block 1 in FIG. 9) is associated with a different sequential data stream than another one of the blocks (e.g., blocks 2 or 3 in FIG. 9, to which streams B and C are written).

In one example, the controller is further configured to receive another host write command including a random data stream (e.g., host write command 910), and in response to determining the host write command includes the random data stream (e.g., at block 1006), to write the random data stream to an additional one of the blocks (e.g., such as described above at block 1008 and illustrated in FIG. 9 with random open block 904).

In one example, the controller is further configured to determine whether the one of the blocks is open (e.g., sequential open block 1 in FIG. 9 such as described with respect to block 1012), and in response to determining the one of the blocks is open, to write a portion of the sequential data stream to the one of the blocks (e.g., at block 1014).

In one example, after writing the portion of the sequential data stream to the one of the blocks (e.g., at block 1014), the controller is further configured to determine that the one of the blocks is full (e.g., again at block 1012 for a new, current portion of the same data stream), and to write a remainder of the sequential data stream to an additional one of the blocks in response to determining that the one of the blocks is full (e.g., such as described above at block 1016).

In one example, the controller is further configured to determine whether the host write command includes a logical address range overlapping with a stored logical address range of the sequential data stream (e.g., such as described above at block 1010), and to write the at least the portion of the sequential data stream to the one of the blocks in response to the logical address range overlapping with the stored logical address range (e.g., at block 1014).

In one example, the controller is further configured to obtain a maximum number of sequential data streams to be allocated to individual ones of the blocks (e.g., at block 1002 or block 1004), and wherein, in response to the logical address range not overlapping with the stored logical address range (e.g., the no branch of block 1010) and the sequential data stream (e.g., stream A in FIG. 9) being within the maximum number of sequential data streams (e.g., the no branch of block 1018), the controller is further configured to associate the one of the blocks with the sequential data stream (e.g., such as described above at block 1020) prior to writing the at least the portion of the sequential data stream to the one of the blocks.

In one example, in response to the sequential data stream (e.g., stream D in FIG. 9) being over the maximum number of sequential data streams (e.g., the yes branch of block 1018), the controller is further configured to associate a LRU one of the blocks with the sequential data stream (e.g., such as described above at block 1022 and illustrated in FIG. 9 with respect to block 2), and to write the at least the portion of the sequential data stream to the LRU one of the blocks (e.g., also as illustrated in FIG. 9).

In one example, the storage device may include a non-volatile memory including a plurality of blocks; and a controller configured to receive a plurality of host write commands, each of the host write commands including a sequential data stream (e.g., the host write commands including streams A, B, and C in FIG. 9), to write each of the sequential data streams to a different one of the blocks in response to the host write commands (e.g., sequential open blocks 1, 2, and 3 respectively in FIG. 9), and to read each of the sequential data streams respectively from the different ones of the blocks (e.g., in the example of FIG. 9, after streams A, B, and C are written to the sequential open blocks 906, the controller 901 may respectively read stream A from block 1, stream B from block 2, and stream C from block 3, for example, in response to respective host read commands).

In one example, the controller is further configured to relocate one of the sequential data streams from a LRU block including another sequential data stream. As an example, referring to FIG. 9, stream D may include updated data for stream B (e.g., if the host write command 916 is intended to overwrite the prior data in stream B), and both streams may be stored in the same sequential open block if stream D is received or processed when sequential open block 2 is LRU. In such case, stream B may include invalid data and stream D may include valid data in the LRU block. As a result, the controller may relocate stream D data from the block including the stream B data (e.g., such as described above with respect to FIG. 6).

In one example, in response to an invalidation of one of the sequential data streams in one of the blocks, the controller is further configured to erase the one of the blocks without performing a data relocation. As an alternative example, referring to FIG. 9, stream C may include updated data for stream A (e.g., if the host write command including stream C is intended to overwrite the prior data in stream A), and both streams may be stored in different sequential open blocks such as block 1 and block 3 in this example. In such case, stream A may include invalid data and stream C may include valid data in different sequential blocks. As a result, the controller may release or erase block 1 without having to relocate any valid data (e.g., according to the data relocation process described above with respect to FIG. 6), since block 1 in this example is allocated only to stream A and therefore only contains the invalid data from stream A.

In one example, the storage device includes a volatile memory (e.g., volatile memory 118, 914) configured to store the sequential data streams (e.g., streams A, B, C in FIG. 9), wherein a maximum number of the sequential data streams (e.g., obtained at block 1002 or 1004) is based on a host write pattern and a size of the volatile memory.

In one example, the host write commands are received in parallel from a host device (e.g., in parallel host write commands 912).

In one example, the host write commands are received serially from a host device (e.g., one of the host write commands may include stream A in FIG. 9, while a subsequent one of the host write commands may include stream D in FIG. 9).

Thus, the storage device of the present disclosure provides an optimal data management stream to improve sequential read performance. By allocating multiple sequential open blocks respectively to different sequential data streams, sequential data from multiple streams may not be stored in a mixed or interleaved pattern in a same sequential block. As a result, the controller may perform fewer read commands (NAND senses) of a block to obtain a sequential data stream than in a block containing scattered data from multiple streams. The number of read commands the controller may perform to obtain the sequential data stream may be a single command or multiple commands depending on the amount of data requested by the read and the quantity of data read per command based on storage device capability. Additionally, by storing multiple sequential streams in an LRU block, the controller may readily identify the boundaries of each stream, allowing for easier data management with a reduced number of reads or data relocations and consequently improved performance.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a volatile memory;
   a non-volatile memory including a plurality of blocks; and
   a controller configured to:
   determine a number of blocks of the plurality of blocks for which to write sequential data associated with parallel host write commands, wherein the number of blocks is determined based on an average value associated with previously received sequential data streams and a size of the volatile memory;
   receive a plurality of parallel host write commands, each of the plurality of parallel host write commands including a sequential data stream; and
   write each of the sequential data streams to a different one of the number of blocks in response to the parallel host write commands.

2. The storage device of claim 1,
   wherein the number of blocks is indicative of a maximum number of sequential data streams to be allocated to individual ones of the number of blocks,
   wherein the controller is further configured to obtain the maximum number of sequential data streams, and
   wherein the controller is further configured to write each of the sequential data streams to the different one of the number blocks in response to a number of the sequential data streams being at most equal to the maximum number of sequential data streams.

3. The storage device of claim 2, wherein the maximum number of sequential data streams is based on a write amplification limit for sequential data swaps between the volatile memory and the non-volatile memory.

4. The storage device of claim 1, wherein the controller is further configured to:
   receive another host write command including another sequential data stream;
   determine a least recently used (LRU) block from the number of blocks; and
   write the other sequential data stream to the LRU block in response to the determination.

5. The storage device of claim 4, wherein the LRU block indicates an end of one of the sequential data streams and a beginning of the other sequential data stream.

6. The storage device of claim 4, wherein the other sequential data stream is written to the LRU block while each of the sequential data streams are being written in parallel to the different one of the number of blocks.

7. A storage device, comprising:
   a volatile memory;
   a non-volatile memory including a plurality of blocks; and
   a controller configured to:
   determine a number of blocks of the plurality of blocks for which to write sequential data associated with parallel host write commands, wherein the number of blocks is determined based on an average value associated with previously received sequential data streams and a size of the volatile memory;
   receive a plurality of host write commands, each of the plurality of host write commands including a sequential data stream;
   write each of the sequential data streams to a different one of the number of blocks in response to the host write commands; and
   read each of the sequential data streams respectively from different ones of the number of blocks.

8. The storage device of claim 7, wherein the controller is further configured to relocate one of the sequential data streams from a least recently used (LRU) block including another sequential data stream.

9. The storage device of claim 7, wherein in response to an invalidation of one of the sequential data streams in one of the blocks, the controller is further configured to erase the one of the blocks without performing a data relocation.

10. The storage device of claim 7, wherein the host write commands are received in parallel from a host device.

11. The storage device of claim 7, wherein the host write commands are received serially from a host device.

* * * * *